US010143107B1

(12) United States Patent
Zuo et al.

(10) Patent No.: US 10,143,107 B1
(45) Date of Patent: Nov. 27, 2018

(54) ALTITUDE-BASED ADAPTIVE COOLING OF A COMPUTING DEVICE

(71) Applicant: EMC Corporation, Hopkinton, MA (US)

(72) Inventors: Weidong Zuo, Westborough, MA (US); David E. Boudreau, Littleton, MA (US); Joseph P. King, Jr., Sterling, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 378 days.

(21) Appl. No.: 14/968,251

(22) Filed: Dec. 14, 2015

(51) Int. Cl.
*H05K 7/00* (2006.01)
*H05K 7/20* (2006.01)

(52) U.S. Cl.
CPC ..... *H05K 7/20209* (2013.01); *H05K 7/20136* (2013.01)

(58) Field of Classification Search
CPC ....................... H05K 7/20209; H05K 7/20136
See application file for complete search history.

(56) References Cited

U.S. PATENT DOCUMENTS 7,538,509 B1 5/2009 Glover et al.
7,565,226 B1 * 7/2009 Cooley .................. G01M 1/30 700/280
8,738,185 B2 5/2014 Puranen et al.
2003/0173830 A1 * 9/2003 Smith .................. H05K 7/2019 307/117
2004/0009074 A1 * 1/2004 Dodson, III .......... F04D 27/004 417/22
2005/0019162 A1 * 1/2005 Delano ................. F04D 27/002 416/1
2005/0019164 A1 * 1/2005 Delano ................... F04D 27/00 416/61
2006/0023420 A1 * 2/2006 Tucker ...................... G06F 1/20 361/695
2006/0139879 A1 * 6/2006 Holmes ..................... G06F 1/20 361/695
2006/0222045 A1 * 10/2006 Byquist .................... G01K 7/42 374/109

(Continued)

FOREIGN PATENT DOCUMENTS

KR 100682668 B1 2/2007

OTHER PUBLICATIONS

IBM System x3650 M2, Product Guide, Mar. 2009, http://www-07.ibm.com/systems/includes/content/x/pdf/prod_guide.pdf.*

*Primary Examiner* — Christopher E. Everett
(74) *Attorney, Agent, or Firm* — Ryan, Mason & Lewis, LLP

(57) ABSTRACT

An apparatus comprises a memory, a processor coupled to the memory, one or more altitude sensors, one or more ambient temperature sensors, and one or more air movers. The processor implements an air mover control module configured to obtain at least one altitude reading from at least one of the one or more altitude sensors, to determine an altitude factor based on the at least one altitude reading, to obtain at least one ambient temperature reading from at least one of the one or more ambient temperature sensors, to determine target speeds for respective ones of the air movers utilizing the altitude factor and the at least one ambient temperature reading, and to control operation of the air movers based on the target speeds.

20 Claims, 7 Drawing Sheets

(56) References Cited

U.S. PATENT DOCUMENTS

| | | | | | |
|---|---|---|---|---|---|
| 2006/0291994 | A1* | 12/2006 | Bok | G06F 1/206 | 415/47 |
| 2007/0133167 | A1* | 6/2007 | Wagner | H05K 7/20727 | 361/679.4 |
| 2008/0065912 | A1* | 3/2008 | Bodner | G06F 1/206 | 713/300 |
| 2008/0071433 | A1* | 3/2008 | Gross | G01O 5/00 | 701/14 |
| 2008/0304229 | A1 | 12/2008 | June et al. | | |
| 2009/0097203 | A1* | 4/2009 | Byers | H05K 7/20572 | 361/695 |
| 2009/0222147 | A1* | 9/2009 | Nakashima | G06F 1/206 | 700/300 |
| 2009/0249862 | A1* | 10/2009 | Glover | G06F 1/20 | 73/30.04 |
| 2010/0155047 | A1* | 6/2010 | Lin | G05D 23/1932 | 165/288 |
| 2010/0228403 | A1* | 9/2010 | Eto | G05D 23/1931 | 700/300 |
| 2011/0103008 | A1 | 5/2011 | Aklilu et al. | | |
| 2011/0184568 | A1* | 7/2011 | Tai | G05D 23/1934 | 700/282 |
| 2013/0160984 | A1* | 6/2013 | Cash | G06F 1/20 | 165/200 |
| 2014/0063721 | A1* | 3/2014 | Herman | G06F 1/20 | 361/679.31 |
| 2015/0241077 | A1* | 8/2015 | Ogawa | F24F 11/006 | 700/276 |
| 2017/0374760 | A1* | 12/2017 | Chen | G06F 1/20 | |

* cited by examiner

ALTITUDE-BASED ADAPTIVE COOLING OF A COMPUTING DEVICE

FIELD

The field relates generally to computing devices, and more particularly to temperature control for computing devices.

BACKGROUND

Information technology (IT) equipment, such as various compute, networking and storage hardware, may be installed or run at different locations across the globe. It is common for many different instances of the same type of IT equipment to be used in varying locations subject to different environmental conditions, such as at various temperatures and altitudes. As an example, a manufacturer may build rack-mounted servers that are sold, shipped and used in different datacenters around the world. For certain IT equipment or more generally computing devices, it is important to maintain proper cooling in such differing environmental conditions.

SUMMARY

Illustrative embodiments of the present invention provide techniques for efficient cooling of a computing device.

In one embodiment, an apparatus comprises a memory, a processor coupled to the memory, one or more altitude sensors, one or more ambient temperature sensors, and one or more air movers. The processor implements an air mover control module configured to obtain at least one altitude reading from at least one of the one or more altitude sensors, to determine an altitude factor based on the at least one altitude reading, to obtain at least one ambient temperature reading from at least one of the one or more ambient temperature sensors, to determine target speeds for respective ones of the air movers utilizing the altitude factor and the at least one ambient temperature reading, and to control operation of the air movers based on the target speeds.

These and other illustrative embodiments include, without limitation, methods, apparatus, devices, systems and processor-readable storage media.

DETAILED DESCRIPTION

Illustrative embodiments of the present invention will be described herein with reference to exemplary computers, servers, network devices or other types of computing devices. It is to be appreciated, however, that the invention is not restricted to use with the particular illustrative device configurations shown. Accordingly, the term "computing device" as used herein is intended to be broadly construed, so as to encompass, for example, various types of IT infrastructure and equipment, and combinations thereof.

As mentioned above, it is important to maintain proper cooling capability in a range of environmental conditions, such as at different temperatures and altitudes. For example, a general principle of cooling is that an air mover, such as a fan or blower operating at a particular speed, is capable of moving a certain air mass. Air density varies according to altitude. Thus, for IT equipment or more generally computing devices at high altitude, increased air flow is required to compensate for the lower air density.

Figure 1:
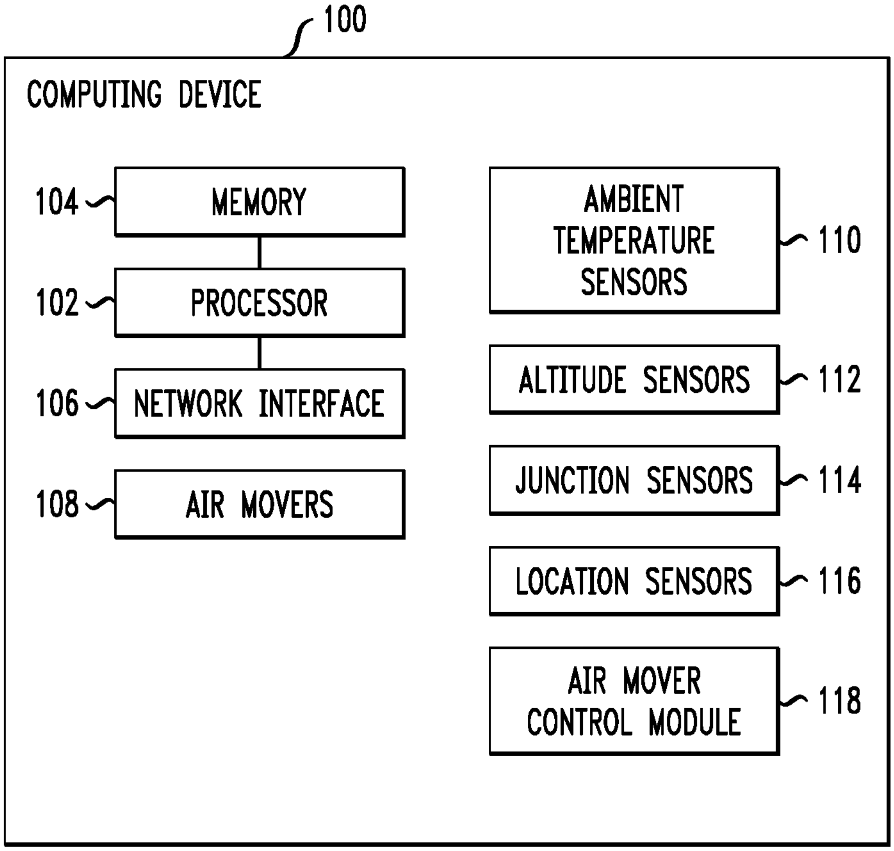
FIG. 1 is a block diagram of a computing device with altitude-based adaptive cooling capability in an illustrative embodiment of the invention.

FIG. 1 shows a computing device 100, including a processor 102 and an associated memory 104. The computing device 100 also includes a network interface 106 coupled to the processor.

The processor 102 illustratively comprises a microprocessor, a microcontroller, an application-specific integrated circuit (ASIC), a field-programmable gate array (FPGA), central processing unit (CPU), or other type of processing circuitry, as well as portions or combinations of such circuitry elements.

The memory 104 illustratively comprises random access memory (RAM), read-only memory (ROM), a hard disk drive (HDD) or other types of memory, in any combination. The memory 104 and other memories disclosed herein may be viewed as examples of what are more generally referred to as "processor-readable storage media" storing executable computer program code or other types of software programs.

Articles of manufacture comprising such processor-readable storage media are considered embodiments of the present invention. A given such article of manufacture may comprise, for example, a storage device such as a storage disk, a storage array or an integrated circuit containing memory, as well as a wide variety of other types of computer program products. The term "article of manufacture" as used herein should be understood to exclude transitory, propagating signals.

The network interface 106 allows the computing device 100 to communicate over a network with other computing devices, and illustratively comprise one or more conventional transceivers. The network may comprise one or multiple different types of networks, including a global computer network such as the Internet, a wide area network (WAN), a local area network (LAN), a satellite network, a telephone or cable network, a cellular network, a wireless network such as a WiFi or WiMAX network, or various portions or combinations of these and other types of networks. A network in some embodiments may therefore comprises combinations of multiple different types of networks each comprising computing devices such as computing device 100 configured to communicate using IP or other related communication protocols.

The computing device 100 may comprise, for example, a desktop computer, laptop computer, server, a network server, a rack-mounted server, or more generally a housing that includes the components shown in FIG. 1. For example, a computing device may include a chassis including some or all of the elements shown in FIG. 1 as well as other computing, networking and storage hardware.

The computing device 100 includes air movers 108, which may be fans having variable speed capabilities. More generally, however, air movers 108 include various types of hardware capable of adapting its speed of operation or speed of cooling. For example, the air movers 108 in some embodiments may by blower assemblies or other types of cooling modules capable of adjusting their respective speed of operation or speed of cooling.

A variety of sensors are also included in the computing device 100. FIG. 1 shows the computing device 100 including one or more ambient temperature sensors 110, one or more altitude sensors 112, one or more junction sensors 114 and one or more location sensors 116. In some embodiments, however, a computing device need not contain all of the different types of sensors shown in FIG. 1. For example, in some embodiments a computing device may not include any location sensors or may not include any junction sensors. In other embodiments, a computing device may contain one or more other types of sensors not explicitly shown in FIG. 1.

Ambient temperature sensors 110 include, by way of example, thermistors, thermocouples, resistance thermometers, silicon bandgap temperature sensors, etc. In some embodiments, all of the ambient temperature sensors 110 of computing device 100 are of a same type, e.g., all the ambient temperature sensors 110 are thermistors. In other embodiments, different ones of the ambient temperature sensors 110 may be different types, e.g., some are thermistors while others are silicon bandgap temperature sensors. Various other combinations are possible, including arrangements in which the computing device 100 includes only a single ambient temperature sensor 110.

The ambient temperature sensors 110 may be placed at one or more different locations on a housing of the computing device 100. For example, the computing device 100 may be a rack-mounted server, with multiple ambient temperature sensors 110 placed at different locations internal and/or external to the rack chassis. If the rack-mounted server includes multiple air movers 108, respective ones of the ambient temperature sensors 110 may be mounted proximate to the different air movers 108. The rack-mounted server may also or alternatively include different air flow paths through its housing or chassis, where different air movers 108 are located in the different air flow paths. In such cases, there may be different ones of the ambient temperature sensors 110 mounted at designated locations in the different air flow paths. Various other arrangements are possible, examples of which will be discussed in further detail below with respect to FIGS. 8 and 9.

Altitude sensors 112 may include, by way of example, altimeters including pressure altimeters or barometric altimeters, radar altimeters, Global Positioning System (GPS) receivers, etc. The computing device 100 may include any one of or combination of such altimeters.

Junction sensors 114 may include sensors associated with various types of hardware included in the computing device 100. Examples of junction sensors 114 include CPU junction sensors for monitoring the internal temperature of a CPUs, dual in-line memory module (DIMM) junction sensors for monitoring the internal temperature of RAM chips, HDD junction sensors for monitoring the internal temperatures of HDDs, etc. Such junction sensors may be built-in to such components. For example, a HDD may incorporate a HDD junction sensor to self-report its internal temperature. Various other types of hardware, such as graphics cards, motherboards, network interfaces, etc. may also have associated junction sensors.

Location sensors 116 may include, by way of example, position sensors, GPS sensors, etc. In some embodiments, the network interface 106 may form part of a location sensor in a network-assisted location determination utilizing an Internet Protocol (IP) geolocation, one or more cellular or other wireless networks, etc.

The processor 102 of computing device 100 implements an air mover control module 118, which is configured to control the operation of air movers 108 so as to implement altitude-based adaptive cooling as will be described in further detail below. At least portions of the air mover control module 118 may be implemented at least in part in the form of software that is stored in memory 104 and executed by processor 102.

It is to be understood that the particular set of elements shown in FIG. 1 is presented by way of illustrative example only, and in other embodiments additional or alternative elements may be used. Thus, in another embodiment a computing device may include more or fewer sensors than those shown in FIG. 1, as well as different arrangements of modules and other components.

Figure 2:
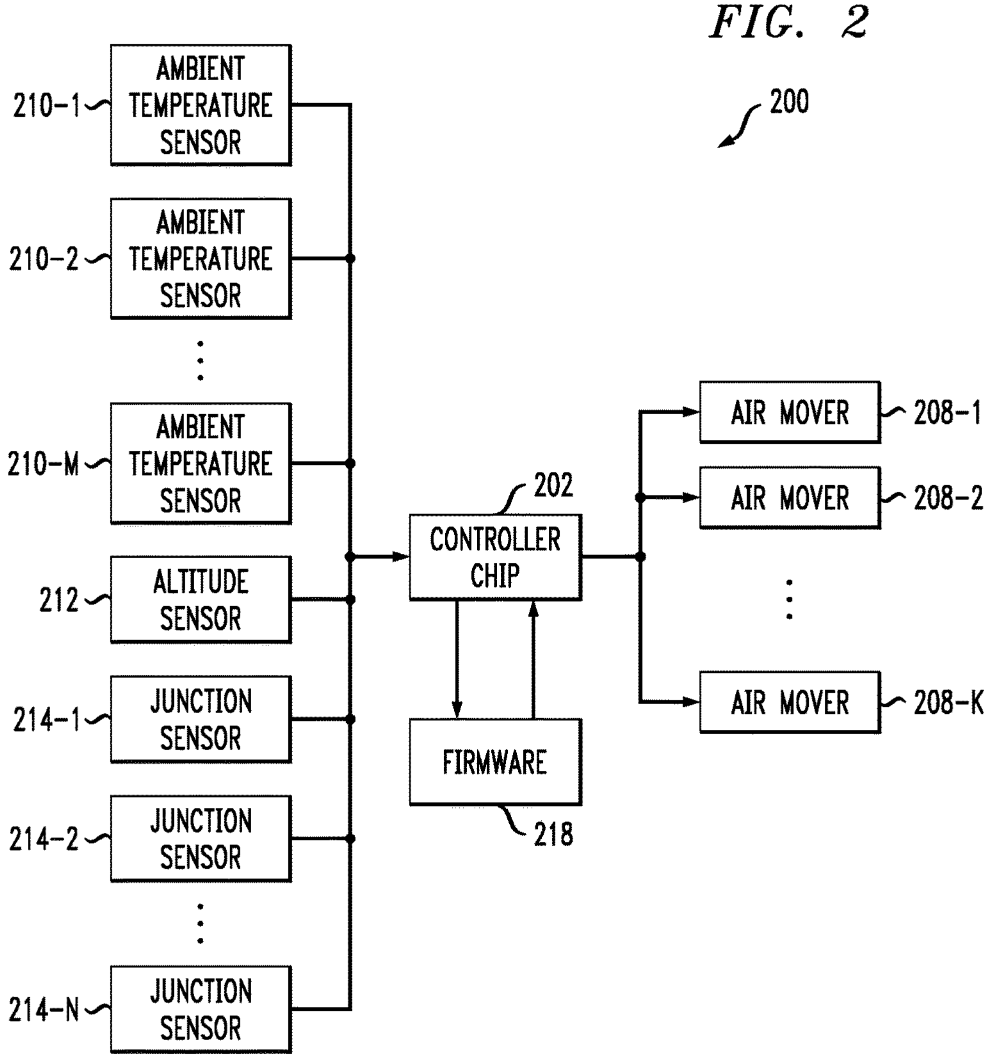
FIG. 2 shows another illustrative embodiment of a computing device with altitude-based adaptive cooling capability.

FIG. 2 shows an example of a computing device 200, which includes various elements similar to those described above with respect to computing device 100, including controller chip 202, air movers 208-1, 208-2, . . . 208-K collectively referred to herein as air movers 208, ambient temperature sensors 210-1, 210-2, . . . 210-M collectively referred to herein as ambient temperature sensors 210, altitude sensor 212, and junction sensors 214-1, 214-2, . . . 214-N collectively referred to herein as junction sensors 214.

Controller chip 202, which may be analogous to the processor 102 in computing device 100, collects information from the various sensors 210, 212 and 214. The controller chip 202 collects ambient temperature readings from the ambient temperature sensors 210. The particular number M of ambient temperature sensors 210 may vary. Generally, the computing device 200 may include one or more ambient temperature sensors as a particular arrangement requires. The ambient temperature sensors 210 may by placed or mounted on different spots within a chassis or housing of the computing device 200. Thus, in some embodiments the ambient temperature readings from respective ones of the ambient temperature sensors 210 may differ from one another, even though they are all mounted or positioned in or around the housing of a same computing device 200.

The controller chip 202 may be configured to gather or obtain temperature readings from different ones of the ambient temperature sensors 210, and select a highest one of the readings as the ambient temperature for use in adaptive cooling algorithms described in further detail below. Embodiments are not limited solely to selecting a highest one of the ambient temperature readings. In other embodiments, the controller chip 202 may compute an average or median of the different ambient temperature readings from ambient temperature sensors 210 and use the average, median or some other value as the ambient temperature for use in an adaptive cooling algorithm.

Also, as will be discussed in further detailed below with respect to FIGS. 8 and 9, in some cases different ones of or groups of the ambient temperature sensors 210 may be associated with different portions of the housing of computing device 200. In such cases, ambient temperature readings from different ones of or different groups of the ambient temperature sensors 210 may be used for independent control of different ones of or groups of the air movers 208.

The controller chip 202 also receives altitude readings from altitude sensor 212. Although FIG. 2 shows a computing device 200 which includes only a single altitude sensor, embodiments are not so limited. In other embodiments, multiple altitude sensors may be utilized. In some embodiments, the controller chip 202 is configured to receive one or more altitude readings from the altitude sensor 212 and convert the altitude readings into an altitude factor for use in an adaptive cooling algorithm as described in further detail below. This conversion may be done on-the-fly using specified algorithms, or may be performed using a table-lookup in an altitude table matching altitude readings with altitude factors. For example, the altitude sensor 212 may be a barometric altimeter that reports the altitude in terms of pressure. An algorithm or table-lookup may be used to convert the pressure or other reading to an altitude factor.

In some embodiments, the controller chip 202 further receives junction temperature readings from junction sensors 214. The junction sensors 214 may be associated with different components of the computing device, including components not specifically shown in FIG. 2. As an example, the junction sensor 214-1 may be a CPU junction sensor, while the junction sensor 214-2 is a DIMM junction sensor, etc. Although shown as separate in FIG. 2, certain elements of computing device 202 may incorporate junction sensors. For example, the controller chip 202 may be implemented by a CPU of the computing device 200, and thus incorporate a CPU junction sensor. The controller chip 202, however, need not be a CPU of the computing device 200.

Similar to the ambient temperature sensors 210, different ones of the junction sensors 214 may be mounted or positioned in different places or portions of the housing of computing device 200. Also, similar to the ambient temperature readings, the controller chip 202 may select a highest one of the junction temperature readings, an average of the junction temperature readings, a median of the junction temperature readings, etc. for use in controlling operation of air movers 208. The controller chip 202 may use a table lookup or other algorithm to convert the ambient temperature readings and/or junction temperature readings into ambient temperature-based and junction-based speeds, which are then scaled using the altitude factor to determine target speeds for respective ones of the air movers 208.

In some embodiments, different ones of the air movers 208 may be controlled based on the altitude factor and the temperature readings from respective ones of the junction sensors 214. For example, assume that the junction sensor 214-1 is a CPU junction sensor and that air mover 208-2 is mounted proximate to or in an air flow path of the housing of the computing device 200 which cools the CPU. The air mover 208-2 may, in some cases, be a dedicated CPU fan. In such arrangements, the temperature reading from junction sensor 214-1 may be utilized in conjunction with the altitude factor and possibly one or more of the ambient temperature readings from ambient temperature sensors 210 specifically for controlling operation of air mover 208-2. More generally, embodiments include arrangements wherein any subset of the ambient temperature sensors 210 and junction sensors 214 are used for controlling the operation of any one of or set of the air movers 208.

As discussed above, controller chip 202 collects data such as temperature readings and altitude readings from various ones of the sensors 210, 212 and 214. Although not specifically shown in FIG. 2, a computing device in some embodiments may also utilize data from other types of sensors such as location sensors 116. The controller chip 202 communicates with firmware 218 to utilize such information to determine target speeds of operation for respective ones of the air movers 208, and then controls operation of the air movers 208 accordingly. The firmware 218 is an example of the air mover control module 118 of computing device 100. Various processes and algorithms for determining target speeds and controlling operation of the air movers 208 will be described in further detail below with respect to FIGS. 5-7.

Proper cooling capability across a range of temperatures and altitudes is an important feature for various types of computing devices. Embodiments utilize altitude information to drive air movers to implement altitude-based adaptive cooling of computing devices.

In order to support a range of temperatures and altitudes, a computing device may utilize a worst-case scenario to determine how to operate air movers. A particular computing device may be run in various locations around the world, ranging from at or below sea level up to several thousand feet above sea level. As an example, a laptop may be carried and run at various different altitudes as the user of the laptop travels. In this case, the laptop may be preprogrammed to operate its fans or other air movers as though it were always operating at a highest supported altitude. As another example, rack-mounted servers may be designed for deployment in datacenters around the world, where different datacenters are in cities of varying altitudes. In this case, the rack-mounted servers may be preprogrammed to operate associated fans or other air movers as though the rack-mounted servers were always installed in a city or other location with the highest supported altitude. As a further example, rack-mounted servers may be designed for deployment in a single datacenter having multiple floors, and thus the altitude may depend on which floor a particular rack-mounted server is installed. In this case, the rack-mounted servers may be preprogrammed to operate their fans or other air movers assuming that the rack-mounted servers are installed in a top floor or highest altitude within the datacenter building.

Operating air movers for a worst case scenario may be acceptable if altitude information is unavailable or uncertain. However, when altitude information is available, utilizing worst-case assumptions can lead to various inefficiencies. For example, utilizing worst-case assumptions to program operation of air movers can waste energy or other resources. As another example, utilizing worst-case assumptions can lead to increased noise or other pollution. In some cases it is desired to maintain quiet acoustics, and thus utilizing worst-case assumptions is not desired.

A general principle of cooling is that air movers, such as fans, are capable of moving a certain air mass. With less air density, higher airflow is required to move the same amount of air mass, thus requiring air movers to operate at an increased speed, or to utilize additional air movers. Equation (1) below details this relationship:

$$Q = \frac{H}{C_p * \rho * \Delta T} \tag{1}$$

where Q denotes airflow, H denotes the amount of heat transferred, $C_p$ denotes the specific heat of air, ρ denotes air density and ΔT denotes temperature change through a cooling area.

Figure 3:
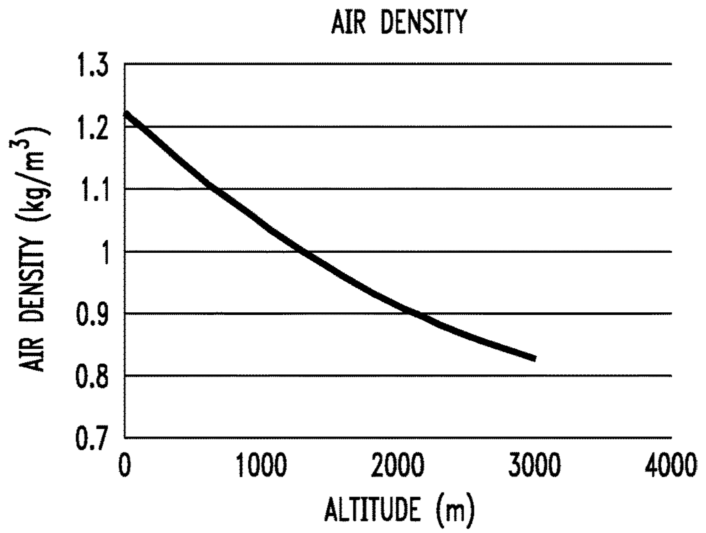
FIG. 3 shows a chart of air density as a function of altitude.

FIG. 3 is a chart depicting the relationship between air density and altitude. As shown in FIG. 3, air density decreases as altitude increases. As mentioned above, air mover cooling capabilities may be managed assuming a worst-case scenario in the absence of altitude information or if altitude information is uncertain. A worst-case scenario may be to assume an altitude of 7500 ft, which is the altitude limit that the American Society of Heating, Refrigerating, and Air-Conditioning Engineers (ASHRAE) specifies should be supported. Of course, in other embodiments various other altitudes may be utilized in a worst-case assumption.

Figure 4:
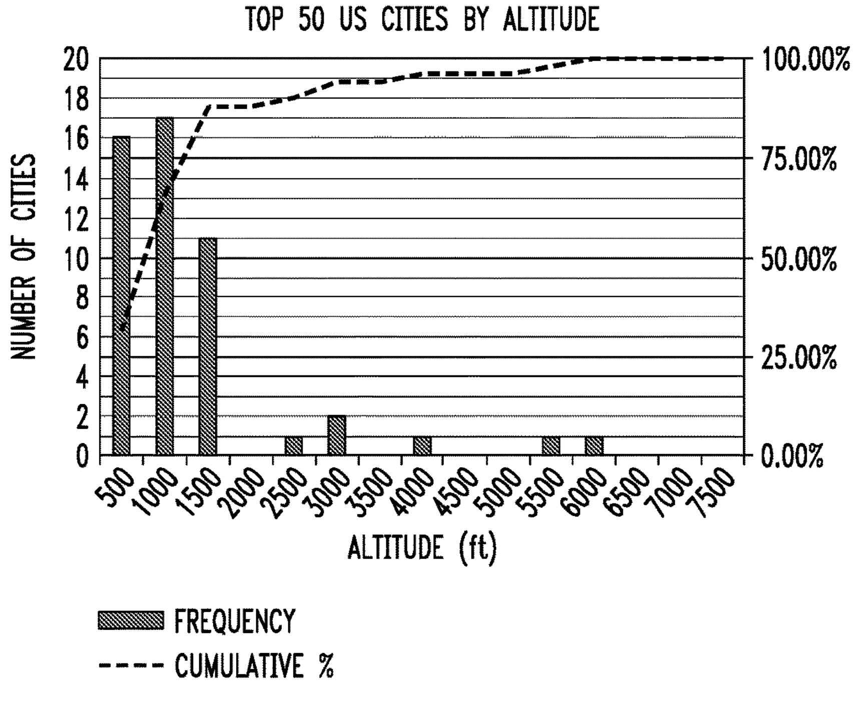
FIG. 4 shows a chart illustrating distribution of altitudes among major cities.

Most IT equipment, or more generally computing devices, will be over-cooled if the worst-case assumption is always utilized thus leading to a waste of cooling energy and an increase in equipment noise. FIG. 4 is a chart which shows the altitude distribution of the top 50 U.S. cities by altitude. As shown, designing for the worst-case altitude of 7500 ft may be wasteful for IT equipment and other computing devices in many locations.

Figure 6:
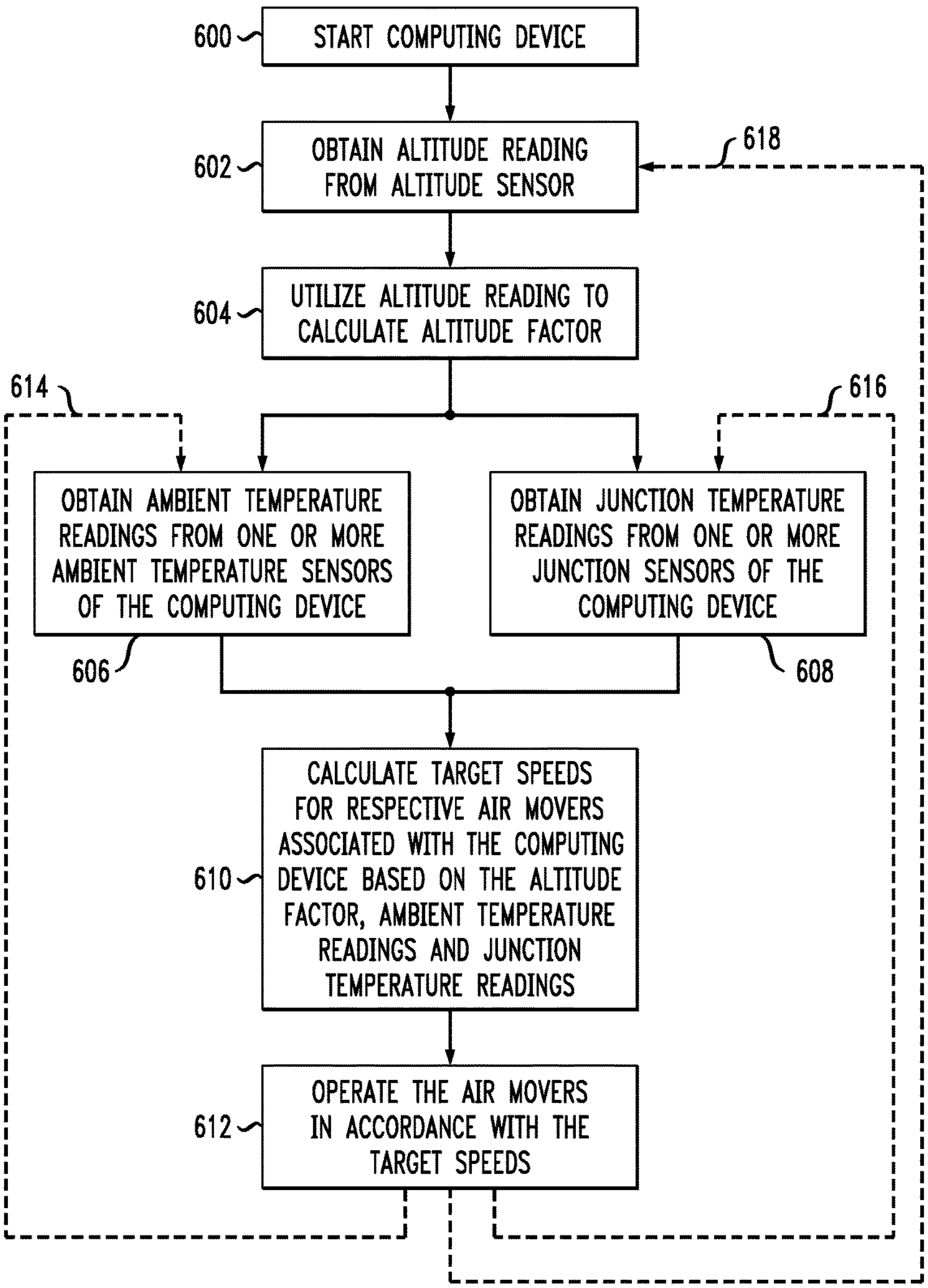
FIG. 6 is a flow diagram of another exemplary process for altitude-based adaptive cooling of a computing device in an illustrative embodiment.
Figure 7:
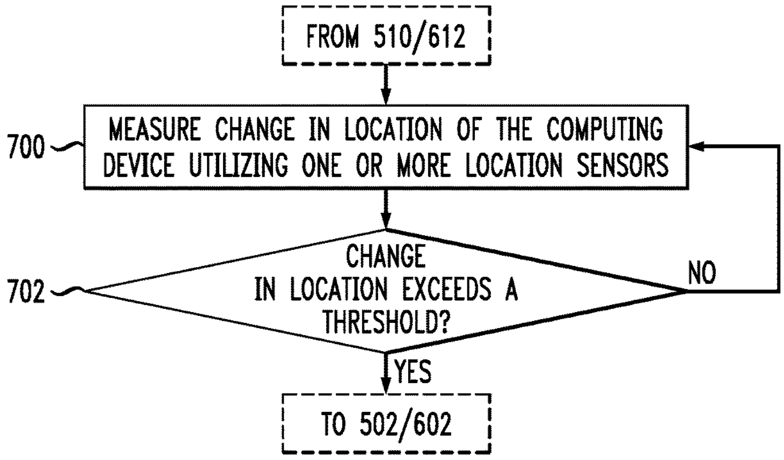
FIG. 7 is a flow diagram of an exemplary process for altitude-based adaptive cooling of a computing device responsive to location changes in an illustrative embodiment.

Exemplary processes for altitude-based adaptive cooling will now be described in more detail with reference to the flow diagrams of FIGS. 5-7. It is to be understood that the particular processes shown in FIGS. 5-7 are only examples, and that additional or alternative processes for altitude-based adaptive cooling of a computing device can be carried out in other embodiments.

Figure 5:
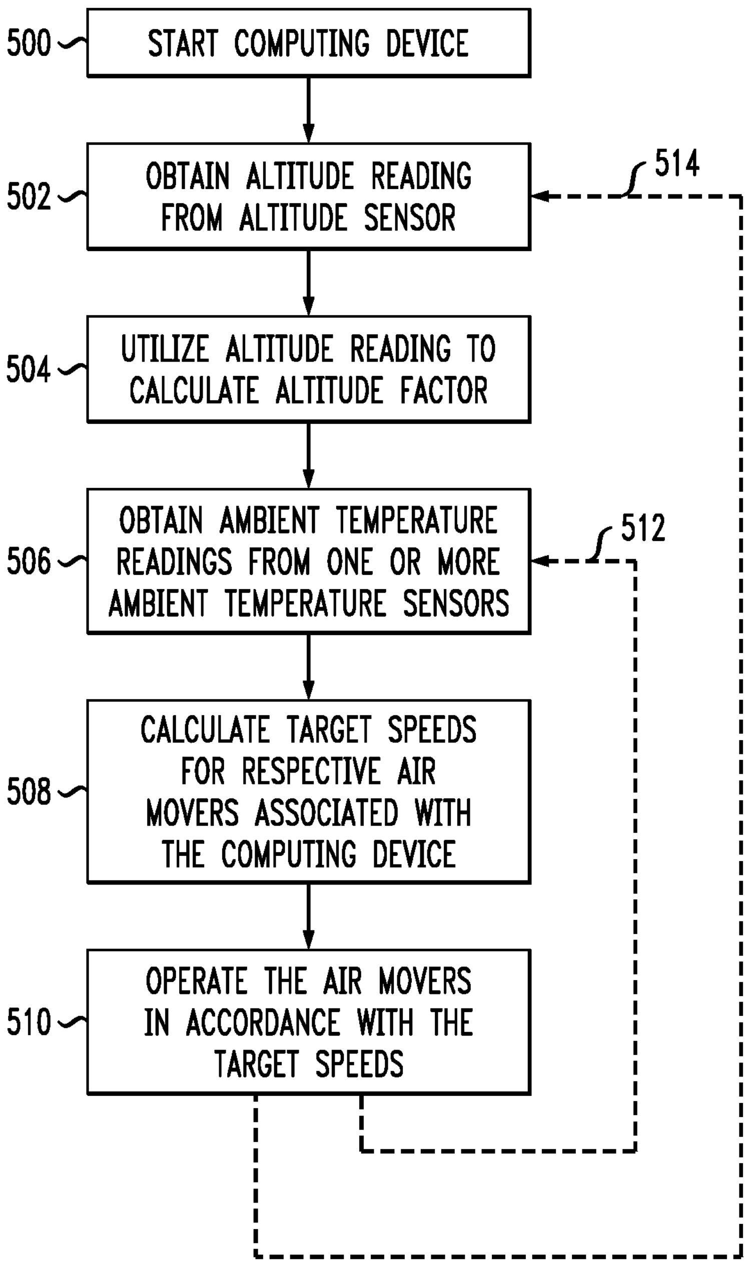
FIG. 5 is a flow diagram of an exemplary process for altitude-based adaptive cooling of a computing device in an illustrative embodiment.

The FIG. 5 process includes steps 500 through 510. In step 500, start-up of a computing device such as computing device 100 or computing device 200 is initiated. Starting up the computing device in step 500 may include powering on the computing device, or may involve initiating altitude-based adaptive cooling of the computing device in response to activation of one or more user interface features of the computing device, either directly at the computing device or remotely over a network.

In step 502, an altitude reading is obtained from an altitude sensor such as altitude sensors 112 or 212. The altitude reading obtained in step 502 is utilized to calculate an altitude factor in step 504. As discussed above, the altitude factor may be calculated on-the-fly using preprogrammed logic or may involve a table lookup using an altitude table, which may be stored in memory 104 or firmware 218.

In step 506, ambient temperature readings are obtained from one or more ambient temperature sensors, such as ambient temperature sensors 110 or 210. The ambient temperature readings may indicate the internal temperature of one or more portions of a housing of a computing device such as computing device 100 or computing device 200, or may alternatively or additionally indicate an ambient temperature external to the housing of the computing device.

Target speeds for respective air movers associated with the computing device, such as air movers 108 and 208, are calculated in step 508. Different ones of or combinations of the ambient temperature readings may be used to control different ones of or combinations of the air movers. Equation (2) below may be used to calculate the target air mover speed in some embodiments:

$$\text{Air Mover Speed}=\text{Ambient Temperature-Based Speed}*\text{Altitude Factor.} \quad (2)$$

The ambient temperature-based speed may be obtained by performing a table look-up or other algorithm relating one or more ambient temperature readings to different speeds.

In step 510, the air movers are operated in accordance with the target speeds determined in step 508. For some embodiments, the target speeds are dynamically updated. For example, in some embodiments feedback path 512, shown as a dashed line in FIG. 5, repeats the processing in steps 506 through 510. The feedback path 512 may be a continuous loop, in that ambient temperature readings are continuously obtained and used to calculate updated target speeds for the air movers. In other embodiments, the feedback path 512 may be periodic, such as performed every minute, hour, day or other time interval.

The feedback path 512 may also or alternatively be in response to an explicit user request or in response to some measured change in circumstances. For example, the feedback path 512 in some embodiments involves monitoring the change in ambient temperature readings where the recalculating or dynamic updating of the target speeds is only performed when the difference in temperature readings exceeds a defined threshold or would cause a change in operation of one or more of the air movers. As an example, certain air movers such as fans may only be controlled to operate in defined levels such as low, medium or high. The feedback path 512 may only be initiated responsive to detecting a change in ambient temperature readings which would cause the target speed to switch from one level to another, In some embodiments, the computing device in the FIG. 5 process is a mobile computing device, or more generally a computing device which is not necessarily in a fixed location. For example, a rack-mounted server may be considered to be a mobile computing device in that it could be moved between datacenters or between different floors in the same building of a datacenter. In such arrangements, it is possible that the altitude factor may change over time, and thus feedback path 514 may be utilized and steps 502 through 510 may be repeated. Similar to the feedback path 512, the feedback path 514 may be a continuous loop, in response to an explicit user request, in response to a change in circumstances, etc. FIG. 7, which will be described in further detail below, shows an exemplary process which may be utilized for determining when to repeat steps 502 through 510 in feedback path 514.

FIG. 6 shows another process for altitude-based adaptive cooling of a computing device. The FIG. 6 process includes steps 600 through 612. Steps 600, 602, 604 and 606 are similar to steps 500, 502, 504 and 506 described above with respect to FIG. 5, respectively.

In step 608, junction temperature readings are obtained from one or more junction sensors, such as junction sensors 114 or 214, of the computing device. The junction sensors are used to determine temperatures of particular components of a computing device such as CPUs, RAM, HDDs, network interfaces, graphics cards, motherboards, or other components or hardware with junction temperature reporting capability.

Whereas in the FIG. 5 process only ambient temperature readings were utilized in conjunction with the altitude factor for determining target speeds for respective ones of the air movers, the FIG. 6 process utilizes the altitude factor, ambient temperature readings and junction temperature readings to calculate target speeds for respective ones of the air movers in step 610. Equation (3) below may be used to calculate the target air mover speed in some embodiments:

$$\text{Air Mover Speed} = \max\begin{pmatrix} \text{Ambient Temperature-Based Speed} * \text{Altitude Factor} \\ \text{Highest Junction-Based Speed} \end{pmatrix}. \quad (3)$$

In Equation (3), junction-based speeds are determined for each of the available junction sensors based on the junction temperature readings from such junction sensors. The highest reported junction-based speed is then compared with the ambient temperature-based speed scaled by the altitude factor, and the maximum of the two is selected as the air mover speed. Equation (4) below describes a specific example of Equation (3) wherein the junction sensors include CPU, DIMM and HDD junction sensors:

$$\text{Air Mover Speed} = \max\begin{pmatrix} \text{Ambient Temperature-Based Speed} * \text{Altitude Factor} \\ CPU \text{ Junction-Based Speed} \\ DIMM \text{ Junction-Based Speed} \\ HDD \text{ Junction-Based Speed} \end{pmatrix}. \quad (4)$$

In other embodiments, Equation (4) may be suitable modified based on the junction sensors available in a particular computing device.

In other embodiments different equations may be used for calculating target speeds for one or more of the air movers of a computing device. By way of example, in some embodiments the junction-based speeds may also be scaled by the altitude factor. In other embodiments, junction-based speeds are used instead of ambient temperature-based speeds rather than in addition to ambient temperature-based speeds. Further, the Equations (2), (3) and (4) may be specific to particular ones of or groups of the air movers. In other words, different air mover speeds may be calculated for at least two of the air movers in a computing device. The differing air mover speeds may result from utilizing readings from junction sensors and/or ambient temperature sensors located proximate to or in an air flow path of those air movers. In other embodiments, one target speed is determined for all of the air movers of a computing device.

Similar to the FIG. 5 process, the FIG. 6 process also includes a number of feedback paths denoted 614, 616 and 618. Each of the feedback paths 614, 616 and 618 may be continuous loops, performed in response to explicit user requests or changes in circumstances, etc. The feedback paths 614 and 618 are similar to those described above with respect to feedback paths 512 and 514, respectively. The feedback path 616 is similar to feedback paths 512 and 614, but repeats obtaining junction temperature readings rather than ambient temperature readings.

As mentioned above, FIG. 7 shows an exemplary process for feedback paths 514 and 618. The FIG. 7 process includes steps 700 and 702, and as shown is performed after step 510 in the FIG. 5 process or after step 612 in the FIG. 6 process. In step 700, a change in location of the computing device is measured utilizing one or more location sensors, such as location sensors 116.

In step 702, a determination is made as to whether the measured change in location exceeds a threshold. The threshold may vary according to the particular configuration of a computing device. For example, the threshold may be selected such that the measured change in location indicates that the altitude may have changed. A change in location of only a few feet, for instance, may be unlikely to cause a significant change in an altitude reading and resulting altitude factor. A change in location of several hundred feet or several miles may be more likely to cause a significant change in the altitude reading and altitude factor. As mentioned above, in some computing devices air movers do not have continuously variable speed settings, but instead have various levels such as low, medium and high. The threshold may thus be further based on the measured change in location being significant enough to affect the altitude factor causing the target speed to move from one level to another.

If the result of determination 702 is yes, then the FIG. 7 process continues to repeat step 502 in the FIG. 5 process or step 602 in the FIG. 6 process. If the result of determination 702 is no, then the FIG. 7 process repeats step 700.

Although the FIG. 7 process is described above in the context of measuring a change in location for feedback paths 514 and 618, similar processes may be used for determining changes in other factors or circumstances for these and other feedback paths such as feedback paths 512, 614 and 616. As one example, the FIG. 7 process may measure a change in time rather than a change in location. As other examples, the FIG. 7 process may measure changes in orientation of a computer housing using gyroscopes or accelerometers, processing load, network throughput, power consumption, etc.

Figure 8:
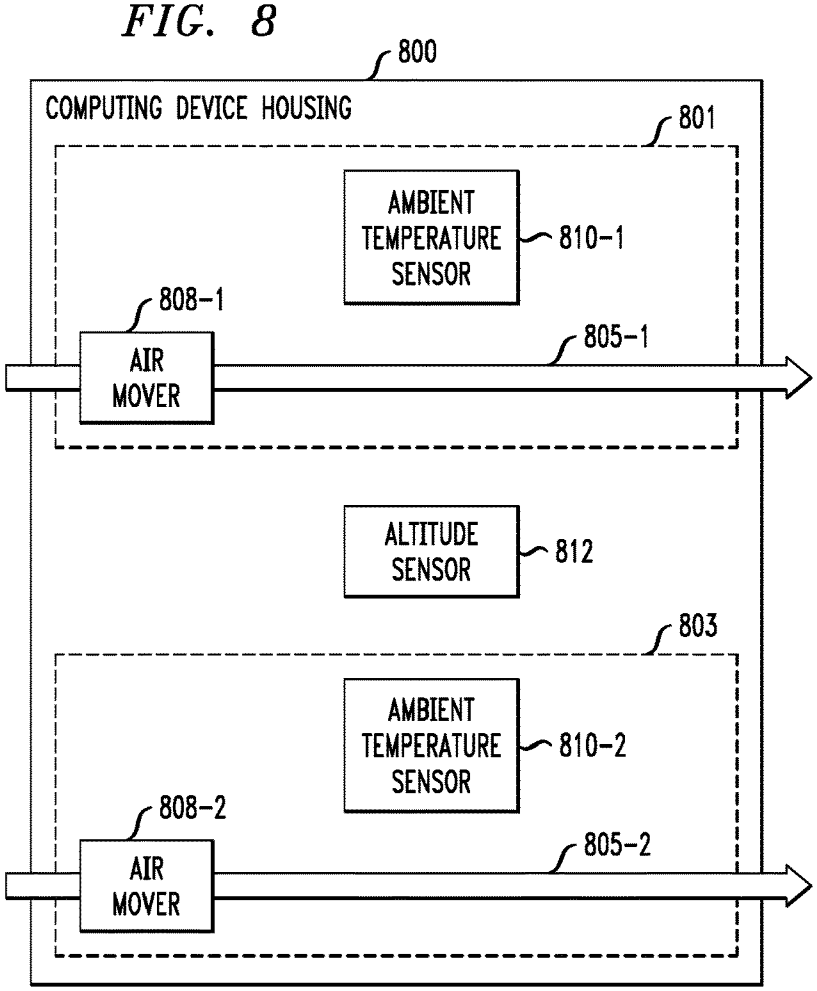
FIG. 8 shows an illustrative embodiment of air movers mounted in a computing device housing.

FIG. 8 shows an example of a computing device housing 800 including a first housing portion 801 and a second housing portion 803. The first housing portion 801 and second housing portion 803 may be associated with different airflow paths through the computing device housing 800. For example, first housing portion 801 may include a motherboard and CPU, RAM, network card, video card, etc. of a computing device while second housing portion 803 includes a power supply and HDDs. Various other examples and arrangements are possible.

The first housing portion 801, as shown, includes air mover 808-1 and ambient temperature sensor 810-1. The second housing portion 803, as shown, includes air mover 808-2 and ambient temperature sensor 810-2. The air mover 808-1 may be primarily responsible for circulating air through the first housing portion 801 while the air mover 808-2 is primarily responsible for circulating air through the second housing portion 803. Arrows 805-1 and 805-2 demonstrate the circulation of air in first housing portion 801 and second housing portion 803, respectively. The housing 800 further includes altitude sensor 812. In other embodiments, multiple air movers and/or multiple ambient temperature sensors may be included in the same housing portion of a computing device. Although not specifically shown in FIG. 8, one or more housing portions may also include other types of sensors such as junction sensors.

In the FIG. 8 example, the FIG. 5 and/or FIG. 6 process may be executed to calculate different target speeds for the different air movers 808-1 and 808-2 in the first housing portion 801 and second housing portion 803, respectively. For example, the target speed for air mover 808-1 may be calculated based on an altitude factor determined using at least one altitude reading from altitude sensor 812 and an ambient temperature reading from ambient temperature sensor 810-1. The target speed for air mover 808-2 may be calculated based on the altitude factor and an ambient temperature reading from ambient temperature sensor 810-2. Since the ambient temperature readings from ambient temperature sensors 810-1 and 810-2 may differ, the target speeds for air movers 808-1 and 808-2 may also differ.

In some embodiments, however, the target speeds for air movers 808-1 and 808-2 may differ even if the temperature readings from ambient temperature sensors 810-1 and 810-2 are the same. For example, the computing device housing 800 may be designed such that greater airflow is needed in one portion of the housing relative to another. Continuing with the example above, in some embodiments the first housing portion 801 including the motherboard, CPU, RAM, network cards, graphics cards, etc. may have stricter cooling requirements relative to the second housing portion 803 including the power supply and HDDs, or vice versa. Different housing portions may also include components of a same type, such as two different housing portions including HDDs. The difference in target speeds may be based on the current load or junction temperature readings of HDDs or other components in the different housing portions.

Figure 9:
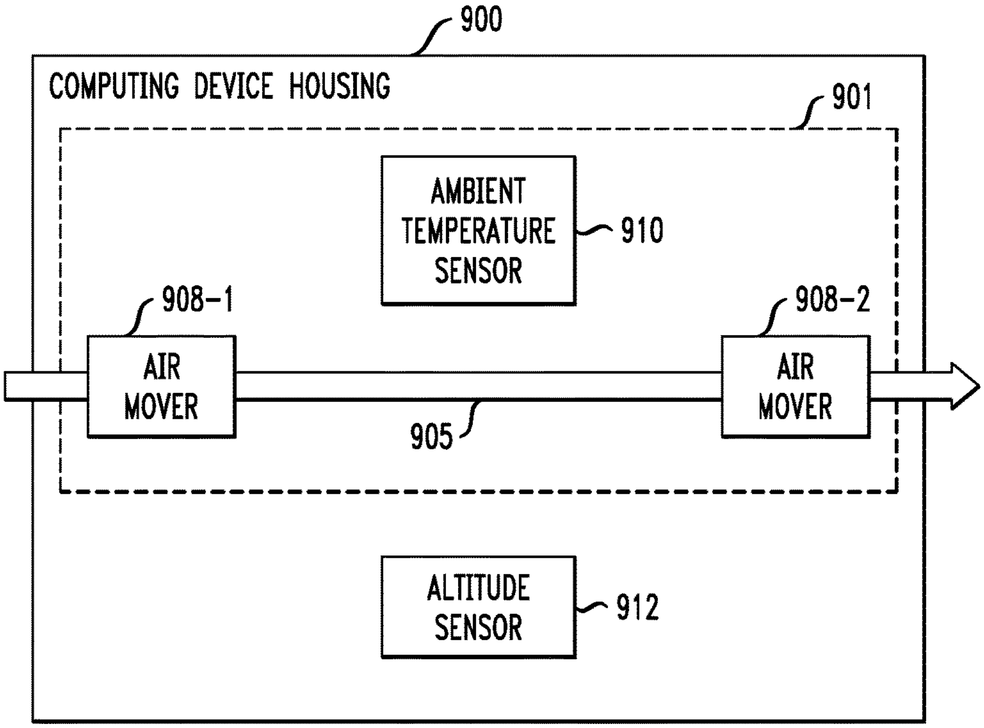
FIG. 9 shows another illustrative embodiment of air movers mounted in a computing device housing.

FIG. 9 shows a computing device housing 900 including a housing portion 901 having multiple air movers 908-1 and 908-2. Arrow 905 illustrates the circulation of air through housing portion 901. In housing 900, air mover 908-1 draws air into housing portion 901 through an intake vent and pushes air towards air mover 808-2 proximate an outtake vent. Ambient temperature sensor 910 measures the ambient temperature of housing portion 901. Ambient temperature readings from ambient temperature sensor 910 can be used in conjunction with an altitude factor determined from altitude readings obtained from altitude sensor 912 so as to control the target speeds of air movers 908-1 and 908-2. The target speeds for air movers 908-1 and 908-2 may differ based on their positioning within the housing portion 901. For example, in some cases it may be preferred that the air mover 908-1 near the intake vent operates at a higher speed than the air mover 908-1 near the outtake vent, or vice versa. The target speeds for air movers 908-1 and 908-2 may also be based on their positioning proximate different components within housing portion 901. For example, air mover 908-1 may be mounted or positioned proximate a CPU while air mover 908-2 is mounted or positioned proximate a HDD. The target speeds for air movers 908-1 and 908-2 may vary based on the cooling requirements of such components, possibly based on junction temperate readings obtained from junction sensors associated with the components.

It is to be appreciated that the particular housing configurations shown in FIGS. 8 and 9 are presented by way of example only. In some embodiments, a housing may include more than two different housing portions. In other embodiments, the particular number and arrangement of air movers and sensors may vary. For example, a particular housing portion may include more or fewer than two air movers, including an arrangement in which a housing portion does not include any air movers. As another example, a particular housing portion may include more or fewer ambient temperature sensors, altitude sensors and other sensors. In addition, the numbers of sensors and air movers in different housing portions need not be the same. For example, a housing may have a first portion with one air mover and a second portion with two or more air movers. Various other modifications are possible.

It should again be emphasized that the above-described embodiments of the invention are presented for purposes of illustration only. Many variations may be made in the particular arrangements shown. For example, although described in the context of particular system and device configurations, the techniques are applicable to a wide variety of other types of system and device configurations. Also, different types and arrangements of modules, sensors, air movers, and other features can be used in other embodiments. Moreover, the assumptions made herein in the context of describing some illustrative embodiments should not be construed as limitations or requirements of the invention, and need not apply in other embodiments. Numerous other alternative embodiments within the scope of the appended claims will be readily apparent to those skilled in the art.

What is claimed is:

1. An apparatus comprising:

a memory;

a processor coupled to the memory;

one or more altitude sensors;

one or more ambient temperature sensors; and one or more air movers;

wherein the processor implements an air mover control module configured:

to obtain at least one altitude reading from at least one of the one or more altitude sensors;

to determine an altitude factor based at least in part on the at least one altitude reading;

to obtain at least one ambient temperature reading from at least one of the one or more ambient temperature sensors;

to determine target speeds for respective ones of the air movers utilizing the altitude factor and the at least one ambient temperature reading; and to control operation of the air movers based at least in part on the target speeds;

wherein the air movers comprise a first air mover in a first position in a chassis of a computing device and at least a second air mover in at least a second position in the chassis of the computing device;

wherein the target speed for the first air mover is calculated based at least in part on the altitude factor, the at least one ambient temperature reading, and the first position of the first air mover with respect to a first air flow path through the chassis of the computing device, the first air flow path comprising an inlet to a given portion of the chassis of the computing device housing a given set of components of the computing device, the first air mover being in the first air flow path;

wherein the target speed for the second air mover is calculated based at least in part on the altitude factor, the at least one ambient temperature reading, and the second position of the second air mover with respect to a second air flow path through the chassis of the computing device, the second air flow path comprising an outlet of the given portion of the chassis of the computing device housing the given set of components of the computing device, the second air mover being in the second air flow path;

wherein the target speed for the first air mover is different than the target speed for the second air mover, the difference between the target speed for the first air mover and the target speed for the second air mover being based at least in part on:

a first set of cooling requirements at the inlet of the given portion of the chassis of the computing device and the first position of the first air mover relative to the inlet to the given portion of the chassis of the computing device, the first set of cooling requirements being based at least in part on a first proximity of the given set of components housed in the given portion of the chassis of the computing device to the inlet; and a second set of cooling requirements at the outlet of the given portion of the chassis of the computing device and the second position of the second air mover relative to the outlet of the given portion of the chassis of the computing device, the second set of cooling requirements being based at least in part on a second proximity of the given set of components housed in the given portion of the chassis of the computing device to the outlet.

2. The apparatus of claim 1 further comprising one or more junction sensors.

3. The apparatus of claim 2 wherein determining the target speed for a given one of the air movers comprises:

calculating a first speed based at least in part on the altitude factor and the at least one ambient temperature reading;

calculating a second speed based at least in part on at least one temperature reading from at least one of the one or more junction sensors; and selecting a higher one of the first speed and the second speed as the target speed for the given air mover.

4. The apparatus of claim 3 wherein calculating the second speed comprises:

calculating junction-based speeds for respective ones of the one or more junction sensors based at least in part on temperature readings from the one or more junction sensors; and selecting a highest one of the junction-based speeds as the second speed.

5. The apparatus of claim 2 wherein the one or more junction sensors comprise one or more central processing unit (CPU) junction sensors configured to monitor internal temperatures of one or more CPUs of the apparatus.

6. The apparatus of claim 2 wherein the one or more junction sensors comprise one or more dual in-line memory module (DIMM) junction sensors configured to monitor internal temperatures of one or more random access memory (RAM) chips of the apparatus.

7. The apparatus of claim 2 wherein the one or more junction sensors comprise one or more hard disk drive (HDD) junction sensors configured to monitor internal temperatures of one or more HDDs of the apparatus.

8. The apparatus of claim 1 wherein:

the memory comprises an altitude table matching altitude values with corresponding altitude factors; and determining the altitude factor comprises performing a lookup in the altitude table using an altitude value obtained from the at least one altitude reading.

9. The apparatus of claim 1 wherein the air mover module is configured to dynamically update the target speeds based at least in part on updated ambient temperature readings from at least one of the one or more ambient temperature sensors.

10. The apparatus of claim 1 wherein the computing device is a mobile computing device.

11. The apparatus of claim 10 wherein the air mover module is configured to dynamically update the target speeds based at least in part on updated altitude readings from at least one of the one or more altitude sensors.

12. The apparatus of claim 1 further comprising a third air mover in a third position in the chassis of the computing device, the third air mover being in a third air flow path through the chassis of the computing device, wherein:

the given portion of the chassis of the computing device houses a first set of components of the computing device;

the third air flow path is over an additional portion of the chassis of the computing device, the additional portion of the chassis of the computing device housing a second set of components of the computing device;

the target speeds for the first and second air movers are calculated based at least in part on the altitude factor, a first ambient temperature reading of the given portion of the chassis from a first one of the ambient temperature sensors, and designated types of components in the first set of components housed in the first portion of the chassis of the computing device;

the target speed for the third air mover is calculated based at least in part on the altitude factor, a second ambient temperature reading of the additional portion of the chassis from a second one of the ambient temperature sensors, and designated types of components in the second set of components housed in the second portion of the chassis of the computing device; and wherein the target speeds for the first and second air movers are different than the target speed for the third air mover.

13. The apparatus of claim 1 wherein determining the target speeds for respective ones of the air movers is based at least in part on measuring an orientation of the chassis of the computing device utilizing at least one of a gyroscope and an accelerometer.

14. The apparatus of claim 13 wherein the air mover module is configured to dynamically update the target speeds for respective ones of the air movers responsive to measuring a change in the orientation of the chassis of the computing device utilizing said at least one of the gyroscope and the accelerometer.

15. The apparatus of claim 1 wherein the first set of cooling requirements is based at least in part on junction temperature readings obtained from junction sensors of a first subset of the given set of components proximate the inlet, and wherein the second set of cooling requirements is based at least in part on junction temperature readings obtained from junction sensors of a second subset of the given set of components proximate the outlet.

16. A method comprising:

obtaining at least one altitude reading from at least one altitude sensor of a computing device;

determining an altitude factor based at least in part on the at least one altitude reading;

obtaining at least one ambient temperature reading from at least one ambient temperature sensor of the computing device;

determining target speeds for respective ones of one or more air movers of the computing device utilizing the altitude factor and the at least one ambient temperature reading; and controlling operation of the air movers based at least in part on the target speeds;

wherein the air movers comprise a first air mover in a first position in a chassis of the computing device and at least a second air mover in at least a second position in the chassis of the computing device;

wherein the target speed for the first air mover is calculated based at least in part on the altitude factor, the at least one ambient temperature reading, and the first position of the first air mover with respect to a first air flow path through the chassis of the computing device, the first air flow path comprising an inlet to a given portion of the chassis of the computing device housing a given set of components of the computing device, the first air mover being in the first air flow path;

wherein the target speed for the second air mover is calculated based at least in part on the altitude factor, the at least one ambient temperature reading, and the second position of the second air mover with respect to a second air flow path through the chassis of the computing device, the second air flow path comprising an outlet of the given portion of the chassis of the computing device housing the given set of components of the computing device, the second air mover being in the second air flow path;

wherein the target speed for the first air mover is different than the target speed for the second air mover, the difference between the target speed for the first air mover and the target speed for the second air mover being based at least in part on:

a first set of cooling requirements at the inlet of the given portion of the chassis of the computing device and the first position of the first air mover relative to the inlet to the given portion of the chassis of the computing device, the first set of cooling requirements being based at least in part on a first proximity of the given set of components housed in the given portion of the chassis of the computing device to the inlet; and a second set of cooling requirements at the outlet of the given portion of the chassis of the computing device and the second position of the second air mover relative to the outlet of the given portion of the chassis of the computing device, the second set of cooling requirements being based at least in part on a second proximity of the given set of components housed in the given portion of the chassis of the computing device to the outlet.

17. The method of claim 16 wherein determining the target speed for a given one of the air movers comprises:

calculating a first speed based at least in part on the altitude factor and the at least one ambient temperature readings;

calculating a second speed based at least in part on at least one temperature reading from at least one of the one or more junction sensors; and selecting a higher one of the first speed and the second speed as the target speed for the given air mover.

18. The method of claim 16 wherein:

the computing device is a mobile computing device; and determining the target speeds comprises dynamically updating the target speeds based at least in part on updated altitude readings from the at least one altitude sensor.

19. A computer program product comprising a non-transitory processor-readable storage medium having stored therein program code of one or more software programs, wherein the program code when executed by a computing device causes the computing device:

to obtain at least one altitude reading from at least one altitude sensor of a computing device;

to determine an altitude factor based at least in part on the at least one altitude reading;

to obtain at least one ambient temperature reading from at least one ambient temperature sensor of the computing device;

to determine target speeds for respective ones of one or more air movers of the computing device utilizing the altitude factor and the at least one ambient temperature reading; and to control operation of the air movers based at least in part on the target speeds;

wherein the air movers comprise a first air mover in a first position in a chassis of the computing device and at least a second air mover in at least a second position in the chassis of the computing device;

wherein the target speed for the first air mover is calculated based at least in part on the altitude factor, the at least one ambient temperature reading, and the first position of the first air mover with respect to a first air flow path through the chassis of the computing device, the first air flow path comprising an inlet to a given portion of the chassis of the computing device housing a given set of components of the computing device, the first air mover being in the first air flow path; and wherein the target speed for the second air mover is calculated based at least in part on the altitude factor, the at least one ambient temperature reading, and the second position of the second air mover with respect to a second air flow path through the chassis of the computing device, the second air flow path comprising an outlet of the given portion of the chassis of the computing device housing the given set of components of the computing device, the second air mover being in the second air flow path;

wherein the target speed for the first air mover is different than the target speed for the second air mover, the difference between the target speed for the first air mover and the target speed for the second air mover being based at least in part on:

a first set of cooling requirements at the inlet of the given portion of the chassis of the computing device and the first position of the first air mover relative to the inlet to the given portion of the chassis of the computing device, the first set of cooling requirements being based at least in part on a first proximity of the given set of components housed in the given portion of the chassis of the computing device to the inlet; and a second set of cooling requirements at the outlet of the given portion of the chassis of the computing device and the second position of the second air mover relative to the outlet of the given portion of the chassis of the computing device, the second set of cooling requirements being based at least in part on a second proximity of the given set of components housed in the given portion of the chassis of the computing device to the outlet.

20. The computer program product of claim 19 wherein determining the target speed for a given one of the air movers comprises:

calculating a first speed based at least in part on the altitude factor and the at least one ambient temperature reading;

calculating a second speed based at least in part on at least one temperature reading from at least one of the one or more junction sensors; and selecting a higher one of the first speed and the second speed as the target speed for the given air mover.

* * * * *